United States Patent [19]

Matsui et al.

[11] Patent Number: 4,813,022

[45] Date of Patent: Mar. 14, 1989

[54] STATIC MEMORY WITH PULL-UP CIRCUIT FOR PULLING-UP A POTENTIAL ON A BIT LINE

[75] Inventors: Masataka Matsui, Tokyo; Tetsuya Iizuka, Funabashi; Jun-ichi Tsujimoto, Yokohama; Takayuki Ohtani, Yokyo; Mitsuo Isobe, Yohohama, all of Japan

[73] Assignee: Kabushiki Kaisha Toshiba, Kawasaki, Japan

[21] Appl. No.: 136,769

[22] Filed: Dec. 22, 1987

[30] Foreign Application Priority Data

Dec. 26, 1986 [JP] Japan ................. 61-315317

[51] Int. Cl.[4] .................. G11C 7/00; G11C 11/34
[52] U.S. Cl. ..................... 365/203; 365/190;
365/184; 307/530
[58] Field of Search ............... 365/184, 190, 203, 230,
365/189, 174, 154, ; 307/530

[56] References Cited

U.S. PATENT DOCUMENTS

| | | | |
|---|---|---|---|
| 4,081,701 | 3/1978 | White, Jr. et al. | 365/203 |
| 4,370,737 | 1/1983 | Chan | 365/203 X |
| 4,417,329 | 11/1983 | Mezawa et al. | 365/203 X |
| 4,433,393 | 2/1984 | Ontami | 365/203 X |
| 4,451,907 | 5/1984 | Donoghue et al. | 365/190 |
| 4,459,497 | 7/1984 | Kuo et al. | 307/530 |
| 4,491,741 | 1/1985 | Parker | 365/204 |
| 4,539,494 | 9/1985 | Kurafuki | 365/190 |
| 4,636,983 | 1/1987 | Young et al. | 365/190 |
| 4,658,382 | 4/1987 | Tran et al. | 365/203 X |
| 4,748,349 | 5/1988 | McAlexander, III et al. | 307/530 X |

FOREIGN PATENT DOCUMENTS

| | | | |
|---|---|---|---|
| 54-101230 | 8/1979 | Japan | 365/203 |
| 57-130285 | 8/1982 | Japan | 365/203 |
| 59-218696 | 12/1984 | Japan | 365/184 |

OTHER PUBLICATIONS

Minato et al., "A 20ns 64K CMOS SRAM," IEEE International Solid-State Circuits Conference, ISSCC Digest of Technical Papers, pp. 222-223, Feb. 1984.

*Primary Examiner*—Stuart N. Hecker
*Assistant Examiner*—Alfonso Garcia
*Attorney, Agent, or Firm*—Finnegan, Henderson, Farabow, Garrett, & Dunner

[57] ABSTRACT

The threshold voltage of bit line percharge/equalize MOS transistors is smaller than that of normally ON type bit line pull-up transistors. With this feature, there is no current flows through a bit line from power source $V_{DD}$ during a read-out operation. The voltage difference between a pair of bit lines can be increased at high speed, thereby increasing the read-out speed.

4 Claims, 6 Drawing Sheets

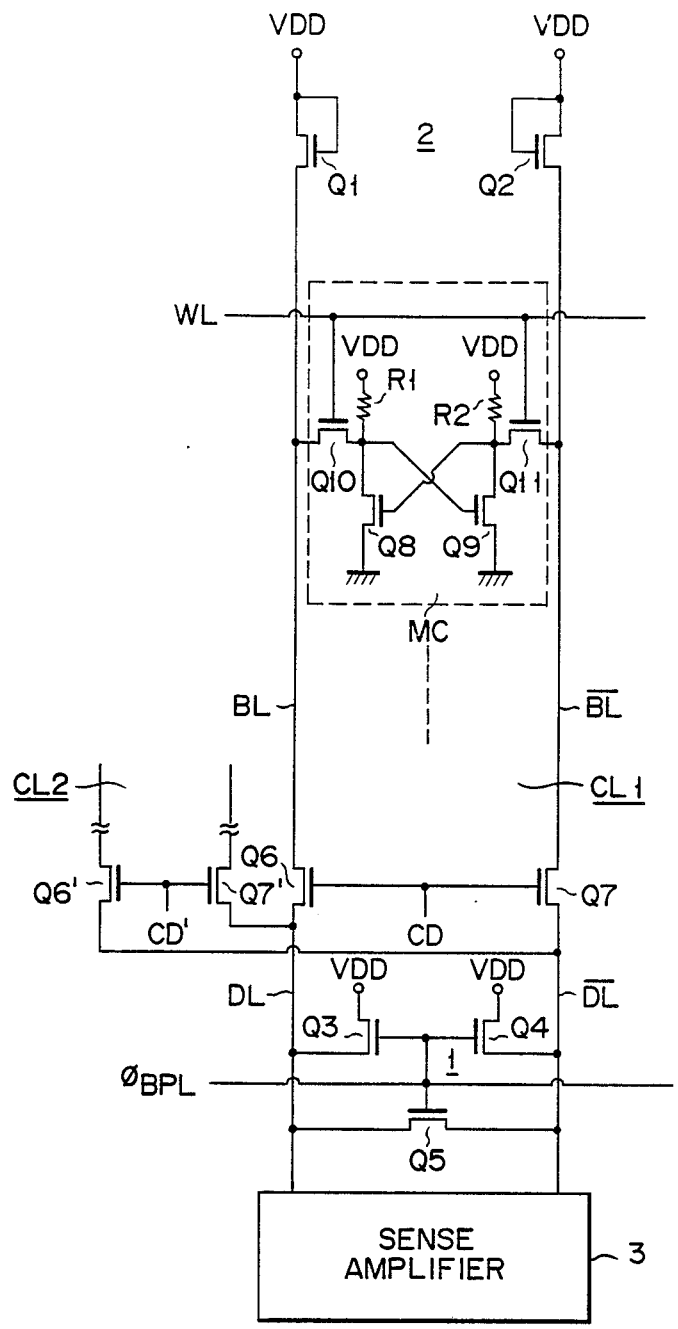
F I G. 5

STATIC MEMORY WITH PULL-UP CIRCUIT FOR PULLING-UP A POTENTIAL ON A BIT LINE

BACKGROUND OF THE INVENTION

This invention relates to improvements of a semiconductor memory and, more particularly, to a bit line circuit section of a static memory using MOS FETs (metal oxide semiconductor field effect transistors).

FIG. 1 shows an example of a prior-art bit line circuit section in one column of a memory cell array of the static type memory made of MOS FETs. BL and $\overline{BL}$ are a pair of bit lines. Memory cell MC (enclosed by a broken line) is a static memory cell. Actually, a plurality of memory cells MC are provided between a pair of bit lines BL and $\overline{BL}$. However, only one of them is illustrated for simplicity. WL is a word line. Word lines WL are provided for memory cells, respectively. However, only one of them that is connected to memory cell MC illustrated, is shown for simplicity. Reference numeral 51 denotes a precharge/equalize circuit for precharging the bit lines and equalizing their potentials. Numeral 52 denotes a pull-up circuit for pulling up the voltages of the bit lines. Q6 and Q7 denote transistors for column selection. Numeral 53 represents a sense amplifier. Memory cell MC comprises a flip-flop and N channel transistors Q10 and Q11. The flip-flop includes transistors Q8 and Q9 as drivers, and high-resistance load resistors R1 and R2. Transistors Q10 and Q11 are transfer gates controlled by a word line select signal. The connection point of load resistor R1 and transistor Q8 and that of load resistor R2 and transistor Q9 form a pair of input/output nodes. One terminal of the source-drain path of transistor Q10 is contacted to the input/output node formed between load resistor R1 and transistor Q8. One terminal of the source-drain path of transistor Q11 is connected to the input/output node formed between load resistor R2 and transistor Q9. The other terminals of the source-drain path of transistors Q10 and Q11 are connected to bit lines BL and $\overline{BL}$, respectively. Load resistor R1 and transistor Q8 are connected in series between power source potential $V_{DD}$ and ground potential $V_{SS}$. Load resistor R2 and transistor Q9 are also connected in series between them.

The operation of the bit line circuit section taken when data is read out, will be described, referring to a timing chart shown in FIG. 2. Assuming that bit line precharge/equalize signal $\phi BPL$ is at an active level (in this example, $V_{DD}$ level), N channel transistors Q3, Q4 and Q5 of bit line precharge/equalize circuit 51 are turned on. Upon the turning-on of the transistors, the potentials of bit lines BL and $\overline{BL}$ are pulled up to voltage level ($V_{DD}-V_{TN}$) by transistors Q3 and Q4 as precharge loads. During the pull-up of voltage, the potential of these bit lines are equalized by equalizer transistor Q5. $V_{DD}$ is a power source potential. $V_{TN}$ is a threshold voltage of each N channel transistor. A word line is then selected, and the drive transistor being at the low potential of memory cell MC which is connected to selected word line WL, lowers the potential of the low potential bit line (in this case, $\overline{BL}$). The potential of the low potential bit line is determined by the difference between the drive current for normally ON type transistor Q2 of bit line pull-up circuit 52 and the pull-in current of the low potential side of the cell and lowered to a mid level between $V_{DD}$ power potential and $V_{SS}$ ground potential. The high potential bit line (in this case, BL) remains almost unchanged at precharge potential ($V_{DD}-V_{TN}$), since transistor Q8 does not pull in any current. The potential change is therefore slight. This causes potential difference $\Delta V$ between a pair of bit lines BL and $\overline{BL}$. Based on the potential difference, data is detected by the sense amplifier 53. Normally ON type transistor Q2 is provided for preventing potential difference $\Delta V$ from becoming so large that the operation of bit lines is slowed down.

In the prior-art static memory of FIG. 1, bit line pull-up transistors Q1 and Q2 and bit line precharge transistors Q3 and Q4 are at same threshold voltage $V_{TN}$. Therefore, normally ON type transistor Q2 for bit line pull-up, which is connected to the low potential bit line (in this case, $\overline{BL}$), is turned on. As the result of the turning-on of the transistor, a DC current flows through $V_{DD}$ power source node, bit line pull-up transistor Q2, low potential bit line $\overline{BL}$, transistor Q11 as a transfer gate and transistor Q9 as a driver of selected MC, and $V_{SS}$ ground node in this order, as shown by the broken line in FIG. 1. This DC current replaces part of the pull-in current of the low potential side of memory cell MC. The pull-in current used for causing the potential difference $\Delta V$ between the bit lines, is reduced. The speed of the increase of the potential difference $\Delta V$ between the bit lines, is decreased. Therefore, the sense operation of the sense amplifier is slowed down. This leads to a problem that the read-out speed of the memory is decreased.

SUMMARY OF THE INVENTION

In view of the foregoing, it is an object of this invention to provide a static memory in which the DC current is prevented from flowing through the bit line from the power source in a read-out mode, and therefore the increase of the potential difference is quickened between paired bit lines, thereby speeding up the read-out operation.

In a static memory according to this invention, the threshold voltage of a bit line precharge N channel transistor of the bit line precharge/equalize circuit, connected either between paired bit lines in each column of a memory cell array and $V_{DD}$ power source node, or between paired data lines commonly connected to a plurality of columns and $V_{DD}$ power node, is smaller than that of the normally ON type N channel transistor for bit line pull-up which is connected between paired bit lines in each column and $V_{DD}$ power source node.

To realize the above object, there is provided a static memory comprising a memory cell array of static memory cells made up of a flip-flop which comprises MOS N channel transistors, and a pair of transistors as transfer gates, pull-up means connected between a $V_{DD}$ power source node and a pair of bit lines in each of a plurality of columns of the memory cell array, the pull-up means being made up of normally ON type N channel MOS transistors for bit line pull-up, and precharge/equalize means made up of N channel transistors and for precharging and equalizing a pair of bit lines in each of a plurality of the columns, the threshold of the N channel transistors being set to a value smaller than that of the pull-up N channel MOS transistors.

With such an arrangement, the bit line pull-up transistor is kept turned off, from when the bit line precharge/equalize circuit operates to when the potential of low potential bit line drops to a certain level. Therefore, no DC current path from the $V_{DD}$ power source is formed in the bit line.

Thus, the potential difference between the pair of bit lines depends only on the electron discharge from the bit lines capacitance, thus realizing the speed-up of the read-out operation of the memory.

BRIEF DESCRIPTION OF THE DRAWINGS

FIG. 5 is a circuit diagram of a bit line circuit section of a static memory, which is another embodiment according to this invention;

DETAILED DESCRIPTION OF THE PREFERRED EMBODIMENTS

Figure 3:
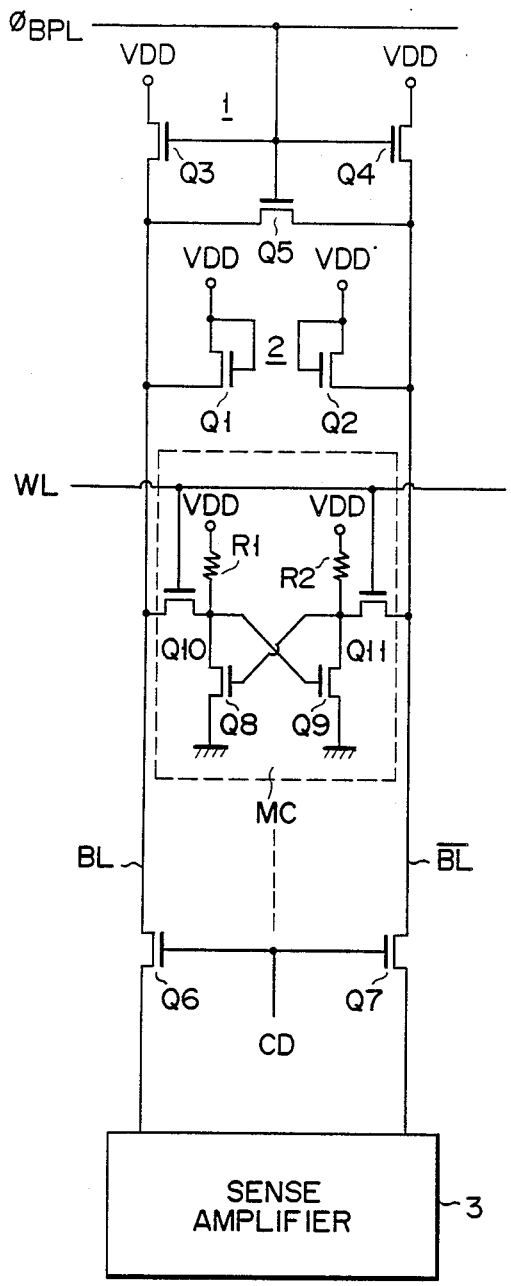
FIG. 3 is a circuit diagram of a bit line circuit section in one column of the memory of a static memory, which is an embodiment according to this invention.

Some specific embodiments of this invention will be described, referring to the accompanying drawings. FIG. 3 shows an embodiment of a static memory according to this invention, specifically a bit line circuit section in one column of the memory cell array containing a memory cell and its peripheral circuit. A pair of bit lines BL and $\overline{BL}$ are connected to a plurality of static memory cells MC, precharge/equalize circuit 1, pull-up circuit 2, a pair of transistors Q6 and Q7, and sense amplifier 3. For simplicity, only one of the static memories is illustrated. Precharge/equalize circuit 1 precharges the bit lines and equalizes their potentials. Pull-up circuit 2 pulls up the potentials of BL and $\overline{BL}$. Transistors Q6 and Q7 are used for column selection. Word line L is connected to memory cell MC. Although not shown in the drawing, word line WL is connected to a plurality of memory cells. Memory cell MC comprises a flip-flop and N channel transistors Q10 and Q11. The flip-flop includes N channel transistors Q8 and Q9 as drivers and high-resistance loads R1 and R2. Transistors Q10 and Q11 are transfer gates controlled by a word line select signal. High-resistance load resistor R1 and transistor Q8, and high-resistance load resistor R2 and transistor Q9 are connected in series between power source potential $V_{DD}$ and ground potential $V_{SS}$, respectively. The connection point of resistor R1 and transistor Q8 and that of resistor R2 and transistor Q9 form a pair of input/output nodes. One terminal of the source-drain path of transistor Q10 is connected to the first input/output node of the flip-flop, i.e., the connection point of N channel transistor Q8 and resistor R1. The other terminal of the source-drain path of transistor Q10 is connected to bit line BL. One terminal of the source-drain path of transistor Q11 is connected to the second input/output node of the flip-flop, i.e., the connection point of the N channel transistor Q9 and resistor load R2. The other terminal of the source-drain path of transistor Q11 is connected to bit line $\overline{BL}$. Bit line precharge/equalize circuit 1 includes N channel transistors Q3, Q4 and Q5. Transistors Q3 and Q4 are used as precharge loads, and are connected between $V_{DD}$ power source node and bit line BL, and between $V_{DD}$ power source node and bit line $\overline{BL}$, respectively. Transistor Q5 is for equalizing the potentials of the bit lines, and is connected between bit lines BL and $\overline{BL}$. Each of transistors Q3, Q4 and Q5 is controlled by a bit line precharge/equalize signal $\phi$BPL supplied to its gate. Bit line potential pull-up circuit 2 is provided for controlling the potential of the low potential bit line when data is read out. Pull-up circuit 2 includes transistors Q1 and Q2 as pull-up loads. Transistors Q1 and Q2 are connected between the $V_{DD}$ power source node and bit line BL, and between the $V_{DD}$ power source node and bit line $\overline{BL}$, respectively. The drain and the gate of each of the transistors are connected together. A pair of transistors Q6 and Q7 for column selection are N channel transistors, and are controlled by supplying column select signal CD to their gates. Sense amplifier 3 is connected to bit lines BL and $\overline{BL}$, via transistors Q6 and Q7, respectively.

The threshold voltage $V_{TN2}$ of transistors Q3, Q4 and Q5 of precharge/equalize circuit 1 and transistors Q6 and Q7 for column selection is set to a value smaller than the threshold voltage $V_{TN1}$ of transistors Q8 and Q9 as drivers, of transistors Q10 and Q11 as transfer gates of memory cell MC, and of pull-up transistors Q1 and Q2 of pull-up circuit 2.

Figure 4:
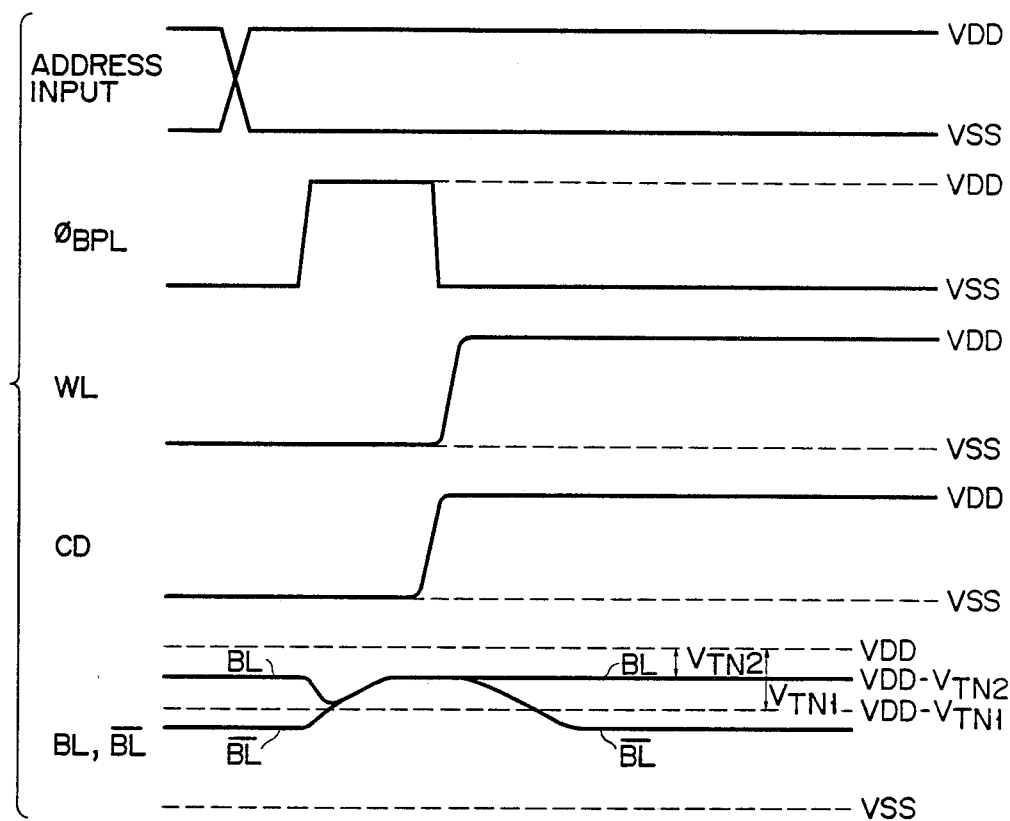
FIG. 4 shows a timing chart for explaining an operation of the memory of FIG. 3.

The operation of the bit line circuit section of the memory in the read-out mode, will be described, referring to FIG. 4. In an address cycle, before column selection and word selection, if precharge/equalize signal $\phi$BPL is at an active level (in this embodiment, $V_{DD}$ level), bit line precharge/equalize circuit 1 is operated, and transistors Q3 and Q4 as prechargers and transistors Q5 as an equalizer are turned on. Upon the turning-on of the transistors, bit lines BL and $\overline{BL}$ are precharged and equalized. Bit lines BL and $\overline{BL}$ are both charged so as to have equal potential ($V_{DD}-V_{TN2}$). $V_{TN2}$ is the threshold voltage of transistors Q3 and Q4 as prechargers. When the $\phi$BPL signal is at a non-active level (in this embodiment, $V_{SS}$ level), and transistors Q3, Q4 and Q5 are turned off, the precharge and equalizing operations are terminated. Word line select signal WL is at a select level (in this embodiment, $V_{DD}$ level), and column select signal CD goes to a select level (in this embodiment, $V_{DD}$ level). A word line and a column are then selected. In this case, when transistors Q10 and Q11 of selected memory cells MC are turned on, and data is output to the pair of bit lines BL and $\overline{BL}$, the potential of the low potential bit line, which is connected to the on-state transistor of those drive transistors Q8 and Q9 of the selected memory cell MC, starts to decrease. The potential in the high potential bit line BL little changes. In this case, the on-state transistor is Q9. This will be used in the description to follow. Therefore, the voltage difference between the pair of bit lines BL and $\overline{BL}$ increases. The voltage difference is detected as data by sense amplifier 3.

The instant that $\phi$BPL signal level becomes nonactive, bit line precharge transistors Q3 and Q4 are turned off. Bit line pull-up transistors Q1 and Q2 are not turned on until the potential difference between bit lines BL and $\overline{BL}$ drops to below ($V_{DD}-V_{TN1}$). $V_{TN1}$ is the threshold voltage of pull-up transistors Q1 and Q2. During the time period when the potential of low potential bit line $\overline{BL}$ is decreased from precharge potential ($V_{DD}-V_{TN2}$) to ($V_{DD}-T_{TN1}$), only the electron charges charged in low potential bit line $\overline{BL}$ are discharged through transistor Q11 as a transfer gate and transistor Q9 as a driver of selected memory cell MC. There occurs no current flowing through the bit line from the power source $V_{DD}$. Therefore, potential difference $\Delta V$ between the pair of bit lines BL and $\overline{BL}$ rapidly increases, and the read-out operation for the memory is performed at a high speed.

When the potential of low potential bit line $\overline{BL}$ is decreased to below $(V_{DD}-V_{TN1})$, pull-up transistor Q2 connected to low potential bit line $\overline{BL}$ is turned on. Upon the turning-on of the transistor, the potential of low potential bit line $\overline{BL}$ is settled down to a potential determined by the drive ability of pull-up transistor Q2 and of selected memory cell MC.

As described above, in the embodiment of this invention, there occurs no current flowing through the low potential bit line from the power source $V_{DD}$ when data is read out. As compared with the prior-art memory of FIG. 1, the speed at which the potential difference increases is high, and therefore, the read-out speed of data is also high. The precharge potential of the bit lines is higher by $(V_{TN2}-V_{TN})$ than in the prior-art memory of FIG. 1. Therefore, if a high-resistance load type memory cell is used, the operation margin determined by the power voltage is increased. In the above-mentioned embodiment, N channel transistors are used as bit line prechargers. As compared with the memory using P channel transistors, the voltage applied across the source-drain path of each of transistors Q10 and Q11 as transfer gates of memory cell MC, is decreased, since the potential of the bit line is lower than the power source potential by $V_{TN2}$. Deterioration of transistors Q10 and Q11 is impeded, and hence the reliability of the memory cell is improved.

The timing of bit line precharge/equalize signal when the signal level becomes active and then is returned to non-active level after the start of read-out operation, is not necessarily required exactly to be coincident with word line selection.

For memory cell MC, a so-called CMOS (complementary MOS) memory cell which employs P channel transistors instead of high resistance load resistors R1 and R2, may be used.

Figure 1:
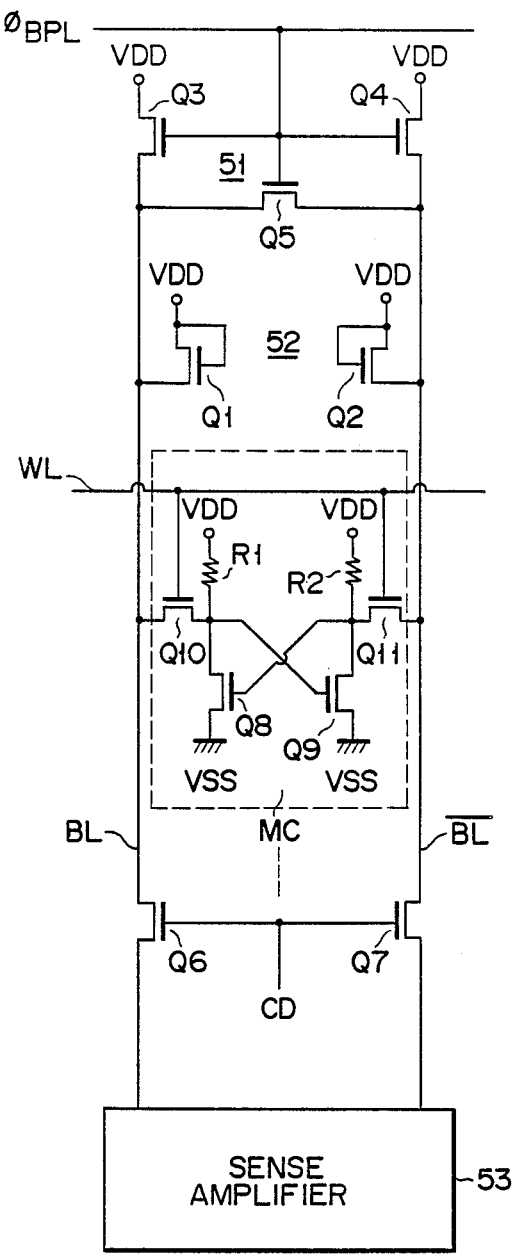
FIG. 1 is a circuit diagram of a bit line circuit section in on column of a prior-art static memory.
Figure 2:
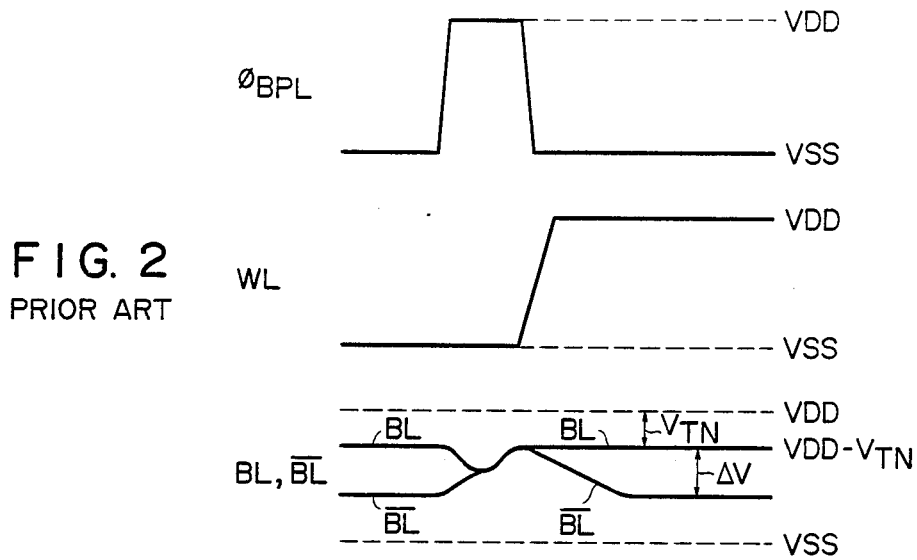
FIG. 2 shows a timing chart for explaining an operation of the prior-art memory of FIG. 1.

FIG. 5 shows another embodiment of this invention. In this embodiment, bit line precharge/equalize circuit 1 and sense amplifier 3 are used in common for a plurality of columns. In the embodiment of FIG. 1, a bit line precharge/equalize circuit is provided for a pair of bit lines in each column. In the FIG. 5 embodiment, a pair of data lines DL and $\overline{DL}$ are connected in common to a plurality of columns. Bit line precharge/equalize circuit 1 is connected between the pair of data lines DL and $\overline{DL}$ and $V_{DD}$ power source node. One common sense amplifier 3 is connected to the pair of data lines DL and $\overline{DL}$. The second embodiment is the same as the FIG. 3 embodiment except with respect to the above points. The same reference numerals as those of FIG. 3 are used in FIG. 5. In FIG. 5, two of the plurality of columns CL1 and CL2 are used. Only the circuit configuration of one column CL1 is illustrated in detail. As for the other column CL2, only the column select circuit comprising N channel transistors Q6' and Q7' is presented.

Figure 6:
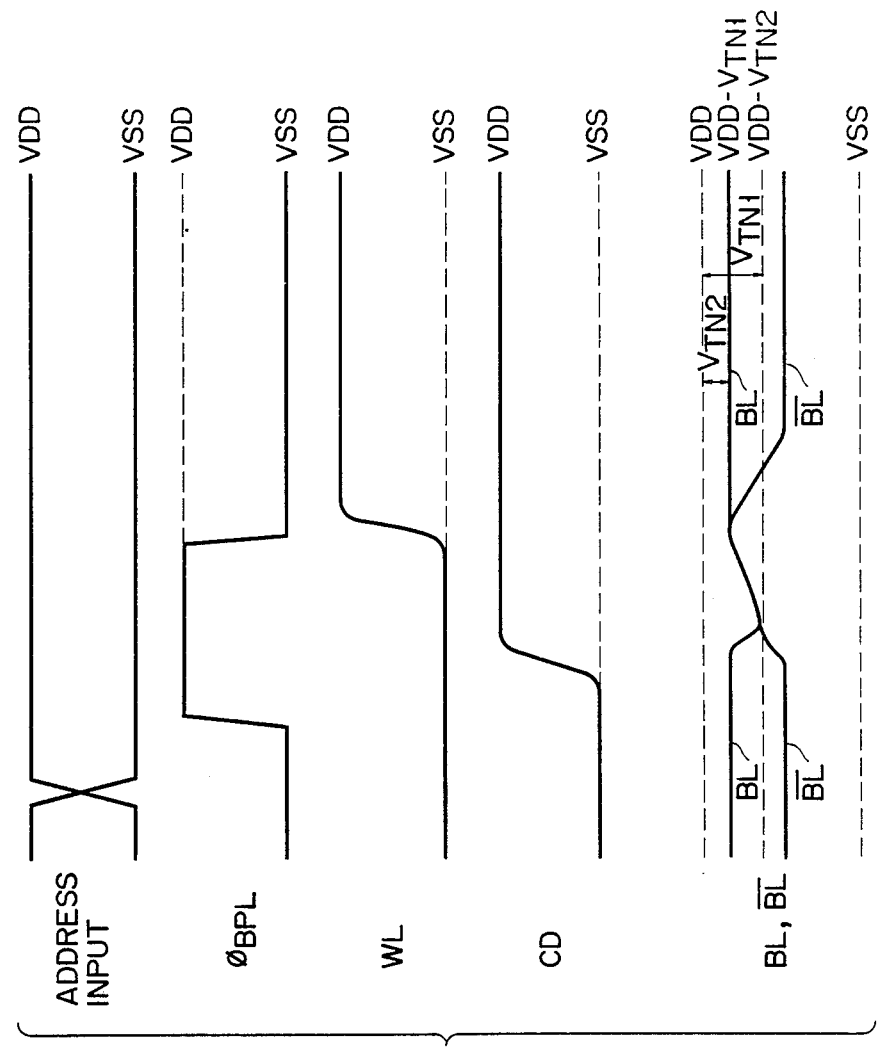
FIG. 6 shows timing chart for explaining an operation of memory of FIG. 5.

The operation of the bit line circuit section of the FIG. 5 memory in the data read-out mode, will be described, referring to FIG. 6. In an address cycle, in each column, bit line precharge/equalize signal $\phi$BPL first is an active level. By this signal, bit line precharge/equalize circuit 1 is operated. During the time period when precharge/equalize signal $\phi$BPL is at the active level, column selecting transistors Q6 and Q7 in one column (in this case, column CL1) selected by column select signals CD, CD' ..., are turned on. A pair of bit lines BL and $\overline{BL}$ of selected column CL1 is precharged and equalized. The pair of bit lines BL and $\overline{BL}$ is precharged to potential $(V_{DD}-V_{TN2})$ Then $\phi$BPL signal goes non-active, transistors Q3, Q4 and Q5 are turned off, and precharge is terminated. Further, word line select signal WL goes to a select level and a word line is selected. With this selection, transistors Q10 and Q11 as transfer gates of selected memory cell MC are turned on, and the data of selected memory cell MC appears on the pair of bit lines BL and $\overline{BL}$. The data is detected by sense amplifier 3. In this embodiment also, as in the FIG. 3 embodiment, there is no current flowing through the bit line from the power source $V_{DD}$, while the potential of the low potential bit line (in this embodiment, $\overline{BL}$) is decreased from $(V_{DD}-V_{TN2})$ to $(V_{DD}-V_{TN1})$ Therefore, potential difference $\Delta V$ between the bit lines increases at a high speed.

In the FIG. 5 memory, the necessity for providing one precharge/equalize circuit for each column is eliminated. Only one precharge/equalize circuit 1 may be provided in common for a plurality of columns. The total number of precharge/equalize circuits used is reduced, so that the bit line potential control system for each column is simplified.

Figure 7:
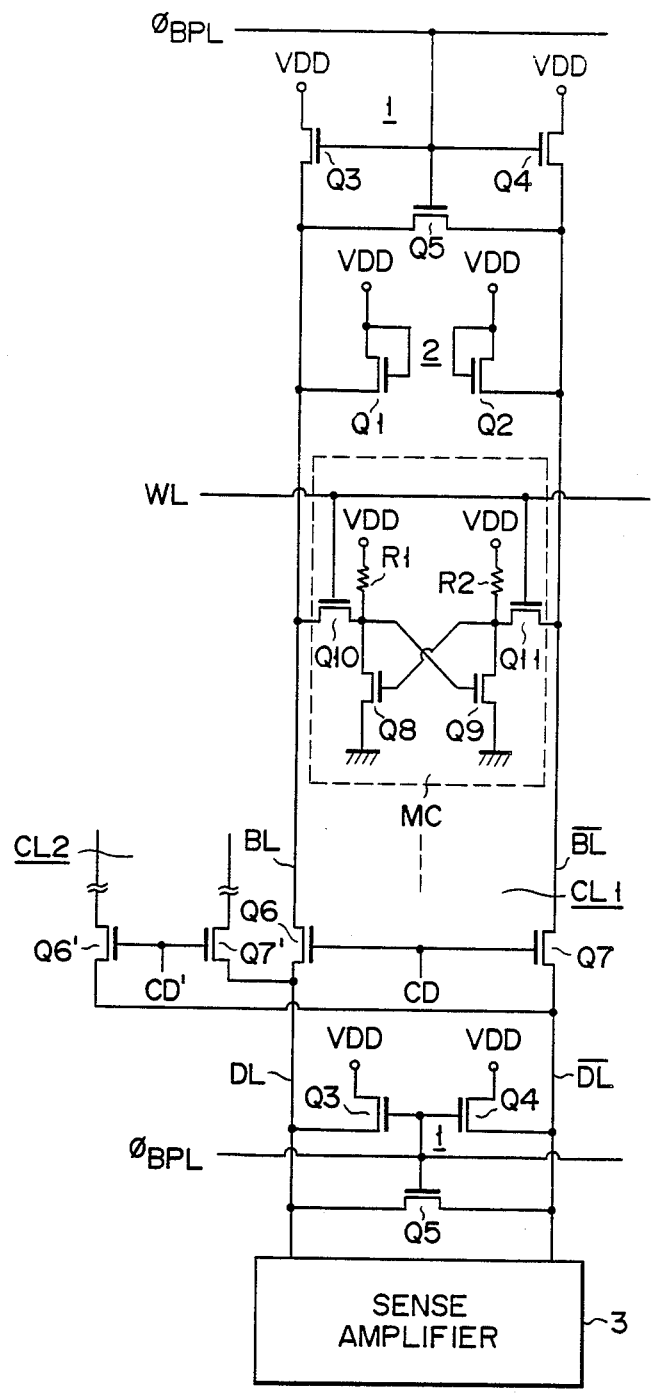
FIG. 7 is a circuit diagram of a bit line circuit section of a static memory, which is still another embodiment according to this invention.

The embodiments of FIGS. 3 and 5 may be combined together to make still another embodiment. As shown in FIG. 7, bit line precharge/equalize circuits may be provided between a pair of bit lines and the $V_{DD}$ power source node in the columns of the second embodiment of FIG. 5. In FIG. 7, only one of them is illustrated for column CL1, for simplicity. With this arrangement, the rise of column select signal CD can be virtually synchronized with that of word line select signal WL. Therefore, these two signals can easily be coincident with each other in time. A pair of bit lines in each column can be precharged and equalized by the bit line precharge/equalize circuit provided for each column. A pair of common data lines DL and $\overline{DL}$ can be precharged and equalized by precharge/equalize circuit 1 provided commonly for a plurality of columns. This makes it easy to adjust the timings of column select signal and bit line precharge/equalize signal $\phi$BPL. This is also advantageous in that the precharge potentials of the pair of bit lines and the pair of data lines can be set to the same value.

As described above, in the static memory according to this invention, the threshold voltage of transistors for bit line precharge/equalize is set to a value smaller than that of normally ON type transistors for bit line pull-up. With this feature, no current flows through the bit line from the power source $V_{DD}$ in the read-out mode. Therefore, the speed at which the potential difference between the bit lines increases, can be increased, thus realizing the speed-up of read out operation.

What is claimed is:

1. A static memory comprising:
  a static memory cell made up of a flip-flop which comprises MOS N channel transistors, and a pair of transistors as transfer gates;
  pull-up means connected to a terminal for receiving a power source voltage and to a pair of bit lines, said pull-up means being made up of N channel MOS transistors for bit line pull-up; and precharge/equalize means made up of N channel transistors, for precharging and equalizing said pair of bit lines, the threshold voltage of said N channel transistors of said precharge/equalize means being set at a value smaller than the threshold voltage of said N channel MOS transistors of said pull-up means.

2. The static memory according to claim 1, wherein said precharge/equalize means is a circuit which is connected to said pair of bit lines and to said terminal for receiving a power source voltage.

3. The static memory according to claim 1, further comprising:

a pair of data lines connected to said pair of bit lines via a pair of transfer gates; and wherein said precharge/equalize means is a circuit which is connected to said pair of data lines and to said terminal for receiving a power source voltage.

4. The static memory according to claim 1 further comprising:

a pair of data lines connected to said pair of bit lines via a pair of transfer gates; and wherein said precharge/equalize means includes a circuit connected to said pair of bit lines to said terminal for receiving a power source voltage, and a circuit connected to said pair of data lines and to said terminal for receiving a power source voltage.

* * * * *